(12) United States Patent
Baron et al.

(10) Patent No.: US 8,988,465 B2
(45) Date of Patent: Mar. 24, 2015

(54) PHYSICAL-VIRTUAL HYBRID REPRESENTATION

(75) Inventors: Elizabeth S. Baron, Saline, MI (US); Richard T. Jakacki, Allen Park, MI (US); Daniel H. Orr, Belleville, MI (US); James Stamper, Jr., Milford, MI (US); David Canfield, Milford, MI (US)

(73) Assignee: Ford Global Technologies, LLC, Dearborn, MI (US)

(*) Notice: Subject to any disclaimer, the term of this patent is extended or adjusted under 35 U.S.C. 154(b) by 186 days.

(21) Appl. No.: 13/435,974

(22) Filed: Mar. 30, 2012

(65) Prior Publication Data
US 2013/0257899 A1 Oct. 3, 2013

(51) Int. Cl.
*G09G 5/00* (2006.01)
*G06T 19/00* (2011.01)
*G02B 27/01* (2006.01)

(52) U.S. Cl.
CPC .......... *G06T 19/006* (2013.01); *G02B 27/01* (2013.01)
USPC .................. 345/633; 345/632; 345/7; 345/8

(58) Field of Classification Search
None
See application file for complete search history.

(56) References Cited

U.S. PATENT DOCUMENTS

| | | | |
|---|---|---|---|
| 8,090,561 B1 * | 1/2012 | Shin | 703/8 |
| 2003/0011619 A1 * | 1/2003 | Jacobs et al. | 345/619 |
| 2005/0073531 A1 * | 4/2005 | Kuroki et al. | 345/633 |
| 2005/0285879 A1 * | 12/2005 | Suzuki et al. | 345/633 |
| 2007/0002037 A1 * | 1/2007 | Kuroki et al. | 345/418 |

* cited by examiner

*Primary Examiner* — Joni Richer
*Assistant Examiner* — Yi Wang
(74) *Attorney, Agent, or Firm* — Raymond L. Coppiellie; Bejin Bieneman PLC (57) ABSTRACT

A virtual environment, including at least one virtual element representing a component of an item is generated. The virtual environment is mapped to a physical environment that includes a physical mockup of at least a subset of the item. The virtual environment is provided to a display. The at least one virtual element is displayed in relation to the physical element according to the mapping.

15 Claims, 7 Drawing Sheets

PHYSICAL-VIRTUAL HYBRID REPRESENTATION

BACKGROUND INFORMATION

Virtual environments may be useful for evaluating items such as products under design. For example, a virtual representation of a complex item may be useful in evaluating various product components and evaluating various design alternatives while the product is under design. When designing a vehicle, for example, it may be useful to create a virtual environment that includes a virtual representation of some or all of the vehicle's interior and/or exterior. For example, a vehicle dash panel may be represented in a virtual environment so that a user can evaluate the appearance of the dash panel. Likewise, a vehicle door, hood, or trunk may be represented in a virtual environment for user evaluation. However, present virtual environments are lacking in their ability to model the real physical world.

DETAILED DESCRIPTION OF PREFERRED EMBODIMENTS

By directly associating virtual and physical models of some or all of a product such as a vehicle, e.g., via an overlay of virtual and physical environments, design alternatives can be visually evaluated in a hybrid virtual environment as well as evaluated in the physical realm. For example, when designing an item such as a vehicle, it may be useful to create a virtual environment that includes a virtual representation of some or all of the vehicle's interior and/or exterior. A physical element such as a vehicle door, steering wheel, or console may be represented in a virtual environment for user evaluation of both appearance and ergonomic assessment. Further, a physical environment could advantageously incorporate one or more seating positions for a user, i.e. so that the user could feel as if he or she is first in a sports car cockpit, and then in a pickup truck command position. In short, a combination of virtual and physical models for evaluating design alternatives allows for consideration of a multitude of design options to develop a design.

Figure 1:
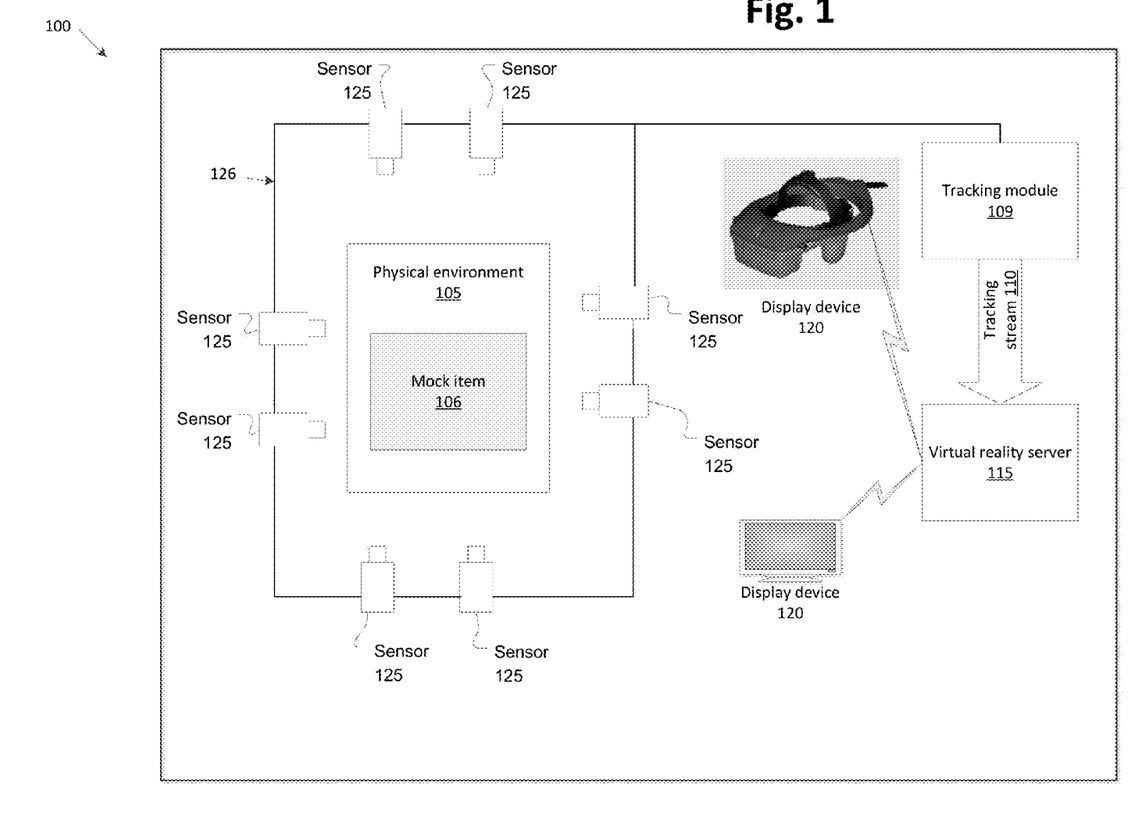
FIG. 1 illustrates an exemplary system for providing an immersive virtual reality environment.

FIG. 1 illustrates an exemplary system 100 for providing an immersive virtual reality environment. The system 100 includes a physical environment 105, that in turn includes a mock item 106. For example, the mock item 106 may represent some or all of an item that is a product under evaluation, e.g., a vehicle such as an automobile. The mock item 106 may include various physical components, examples of which are discussed below with reference to FIGS. 3A-3D. Further, the mock item 106 is generally used to provide context with respect to a virtual representation of portions of an item such as a product under evaluation.

One and generally more sensors 125, such as a set of cameras, may be positioned around a volumetric region 126 around the physical environment 105 to provide a stream of raw data, e.g., video data, from within the volumetric region 126 that can be used to allow a user to interact with a virtual representation of some or all of the mock item 106. The raw data stream may be provided to a tracking module 109 that receives the raw data, e.g., the video stream, from sensors 125, and delivers a tracking stream 110 of virtual-reality data to a virtual reality server 115. Sensors 125 may be cameras, but also could be other kinds of sensors, including inertial, magnetic, optical (active or passive), and/or ultrasonic sensors, etc.

The virtual reality server 115 generates a virtual world, e.g., in monoscopic or, as is usually the case, in stereoscopic format, including a virtual reality environment that in turn may include virtual representations that may be overlaid on the mock item 106, and viewed by a user of a display device 120 with reference to the physical environment 105.

One or more display devices 120 receive output from the virtual reality server 115 to provide the virtual environment, e.g., such as may include a virtual vehicle or some other item to be viewed and evaluated in the virtual environment. A user of a display device 120 may interact with the virtual world generated by the virtual reality server 115, and also with the physical environment 105, including the mock item 106.

The virtual world may be mapped to the physical environment 105. The virtual reality server 115 may use the tracking stream 110 of data to provide an immersive virtual environment to display devices 120. Thus, one or more users of one or more display devices 120, e.g., a head mounted display, a liquid crystal display screen, etc., may be immersed in the virtual environment generated by the virtual-reality server 115. At the same time, such user may be situated within the physical environment 105, viewing portions of a virtual representation of the mock item 106, while interacting with physical elements of the mock item 106. For example, the mock item 106 could be a mockup of a vehicle or a portion of the vehicle, and a user sitting in a seat of the mock item 106 could see virtual representations of various vehicle components, e.g., door panels, dash panels, etc. overlaid on the mock item 106.

Various kinds of display devices 120 may be used in any environment 105. For example, a first display device 120 could be a head-mounted display, such as a fully virtual head-mounted display or a "see-through," or transparent, head-mounted display, worn by a user and presenting a stereoscopic view of a vehicle, and a second display device 120 could be two computer monitors, each presenting one of the two stereoscopic displays provided through the head-mounted display. Display device 120 could also provide audio in addition to visual output. Alternatively or additionally, display device 120 may be a CAVE (CAVE Automated Virtual Environment), a Powerwall (i.e., a large high-resolution display wall used for projecting large computer generated images), a computer monitor such as a high definition television (HDTV), a laptop or tablet computer, etc.

Tracking module 109 may include known software for receiving data from sensors 125 and providing a data stream 110. For example, products and associated tracking software, such as Vicon MX, Vicon Bonita, all from Vicon of Oxford, United Kingdom; the ARTTRACK System from ART of Munich, Germany; the Raptor Real-Time System from Motion Analysis Corporation of Santa, Rosa, Calif.; the Polhemus, PPT system by WorldViz; the IS-900 or IS-1200 from InterSense; MVN Inertial by Xsens; and/or Microsoft Kinect may be used to provide tracking module 109.

Virtual-reality server 115 may include any one of a number of software packages for providing visualization of a virtual environments. Examples of such packages include Motion-Builder® from Autodesk, Inc. of San Rafael, Calif.; the Visual Decision Platform (VDP) from ICIDO of Stuttgart, Germany; Teamcenter from Siemens AG of Munich, Germany; RTT DeltaGen from Realtime Technology AG of Munich, Germany; etc. Using visualization software, the server 115 generates and uses a tracking stream 110 that includes data related to the virtual environment, i.e., data in six degrees of freedom, including X, Y, and Z axes, as well as roll, pitch, and yaw data.

Figure 2:
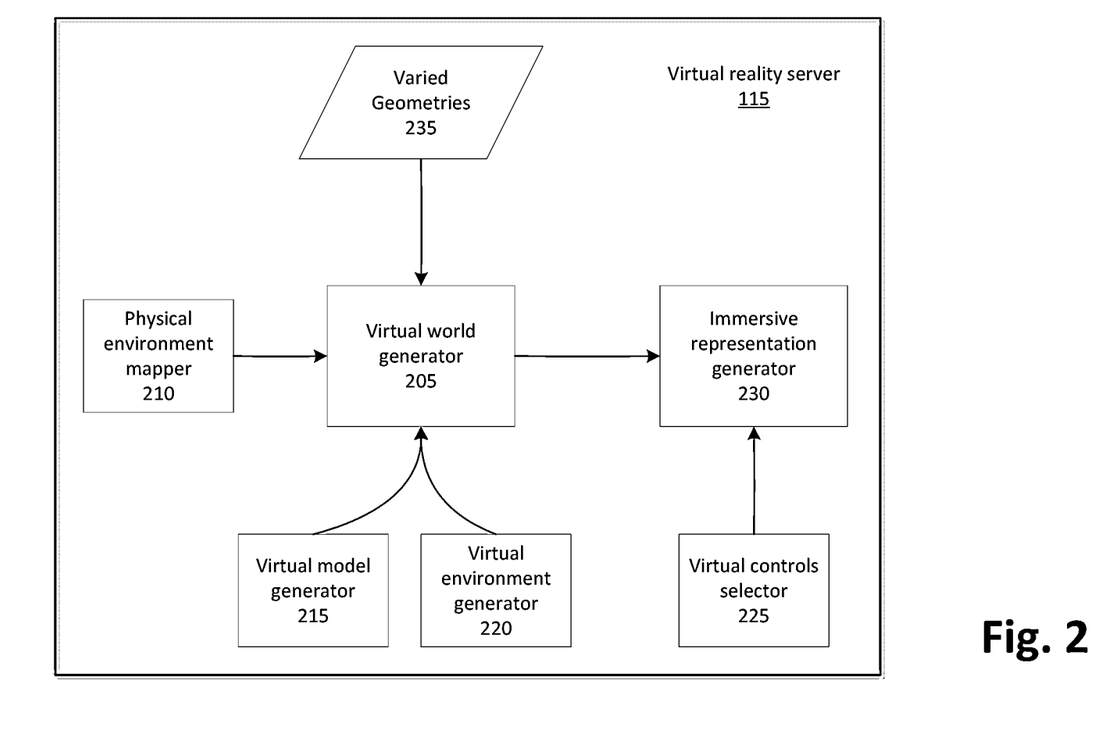
FIG. 2 illustrates further exemplary aspects of a virtual reality server, included in the system of FIG. 1, including elements for providing a virtual environment.

FIG. 2 illustrates further exemplary aspects of a virtual reality server 115, including elements for providing a virtual environment. The system 100 is described in the context of presenting a virtual vehicle, but it is to be understood that the systems and methods presently disclosed have application to many different physical items that may be virtually represented, and are not limited to vehicles. As mentioned elsewhere herein, certain elements disclosed in this specification may be implemented according to computer executable instructions stored on a computer readable medium. For example, some or all of the elements described as included in the virtual reality server 115, may be provided according to computer executable instructions stored and executed on virtual reality server 115.

A virtual world generator 205 generates a virtual model of a vehicle in a virtual environment, and sometimes mapped to a physical environment. Accordingly, virtual world generator 205 may receive input from a physical environment mapper 210, a virtual model generator 215, and/or a virtual environment generator 220. Further, the virtual world generator 205 may use varied geometries 235, which may be stored on virtual-reality server 115 or on some computer-readable medium in a data store accessible to the server 115, and which are described further below, to provide virtual representations of various elements or components viewed in conjunction with a mock item 106.

An immersive representation generator 230 uses a virtual world generated by virtual world generator 205, along with virtual controls provided by a virtual controls selector 225, e.g., according to program instructions included in the immersive representation generator 230 to provide positioning and orientation in the virtual world, to provide a user with an immersive virtual representation of a vehicle from the user's perspective.

Further, immersive representation generator 230 may provide different user perspectives of a virtual world according to a user selection, e.g., via a virtual controls selector 225. For example, a user may be provided different perspectives of a virtual world according to different virtual heights of the user. That is, a user could be given a perspective of a virtual world that a 6'1" tall person would have, and then, according to a selection of a virtual controls selector 225, begin in a perspective of a virtual world that a 5'4" person would have. The ability to provide different user perspectives advantageously allows a user to experience a virtual world, and a vehicle in the virtual world, from the perspective of people with differing virtual attributes.

Also, the immersive representation generator 230 may provide different perspectives to different users of the virtual world, e.g., a first user may have a perspective of standing near the hood of a virtual vehicle 130, while a second user may have a perspective of standing near the trunk of the virtual vehicle 130.

Further, as discussed in more detail below with reference to FIGS. 3A-3D, a user may have the ability to toggle or swap virtual components displayed with reference to a mock item 106, e.g., a user experiencing a virtual display of vehicle components may be able to swap or alter those vehicle components with reference to the mock item 106, e.g., a physical mockup of at least portions of a vehicle.

Physical environment mapper 210 is used to register a virtual reality coordinate system to physical environment 105. Further, the physical environment 105 may include, referenced by the coordinate system, real world, i.e., physical, objects such as a mock item 106. For example, a mock item 106 may be provided with various points such as seats, a dashboard, steering wheel, instrument panel, etc., or may be used to represent different seating positions in a vehicle or in different types of vehicles, etc.

Accordingly, to allow a user of display device 120 to interact with the virtual world provided by virtual world generator 205 and immersive representation generator 230, physical environment mapper 210 may be used to map points in a physical framework, e.g., a mockup of a vehicle, to a coordinate system used by the virtual world generator 205. For example, points may be oriented with respect to the ground, and may include vehicle points based on vehicle dimensions such as height of the vehicle from the ground, height of doors, interior width at various points, etc. Further, a coordinate system used by physical environment mapper 210 may include a mechanism for aligning and transforming a virtual world to be properly mapped to the coordinate system for the physical world. Thus, a virtual representation of components or elements of a virtual vehicle may be superimposed or overlaid on the mock item 106 as a user clicks through a display device 120, e.g., a head mounted display. Such superimposition or overlay is discussed further below with respect to FIGS. 3A-3D.

Virtual model generator 215 provides a virtual model of a product such as a vehicle so that a complete product model may be provided in the virtual world generated by virtual world generator 205. Virtual model generator 215 makes use of what is sometimes referred to as a nominal geometry, i.e., a geometry that provides all of the basic elements of a product such as a vehicle. Further, virtual model generator 215 may use what is sometimes referred to as an appearance database, i.e., a data store of various textures, shaders, etc., that may be applied to a product such as a vehicle. For example, a vehicle may be modeled with leather seats and a tan interior, cloth seats and a black interior, etc. Numerous different components of a vehicle may have different textures, colors, etc. In addition, the nominal geometry includes coordinate information for various product components.

Virtual environment generator 220 is used to generate aspects of a virtual world other than a product, e.g., a vehicle, representation. For example, virtual environment generator 220 receives input with respect to lighting in a virtual world, illustrates shadows and reflections, and provides perspective. With respect to lighting, ray tracing, which calculates how light bounces from one surface to another, may be important, and may enhance a virtual representation. With respect to perspective, virtual environment generator 220 may provide a perspective for a person of a certain height. As mentioned above, immersive representation generator 230 may make available different perspectives in a virtual environment.

In addition, virtual environment generator 220 may control what is sometimes referred to as a variation mapping. That is, different virtual models, e.g., according to different nominal geometries, may be provided by virtual model generator 215 and mapped to different varied geometries 235.

In general, a varied geometry 235 represents a set of possible conditions with respect to a component of a product such as a vehicle. For example, a first varied geometry 235 may represent a first configuration of elements such as elements on a vehicle dashboard, while a second varied geometry 235 represents a second configuration of elements on the vehicle dashboard. Of course, more than two varied geometries 235 may be available with respect to any component that may be overlaid on a mock item 106. Further, varied geometries 235 may be available for a wide variety of components overlaid on the mock item 106. As mentioned above, varied geometries 235 are provided as input to virtual world generator 205.

Virtual controls selector 225 provides a mechanism for selecting controls of an input device, e.g., keyboard, mouse, pointing device, etc., that can be used to select various events in the virtual world provided by virtual world generator 205. For example, various aspects of a virtual model could be subject to change according to user input, e.g., a type or location of a gear shift lever, dashboard controls, various styling choices, etc. Further, virtual controls selector 225 could be used to choose among the very geometries 235, e.g., to further control a user's view of a virtual representation overlaid on a mock item 106.

Immersive representation generator 230 combines the virtual world provided by virtual world generator 205 with virtual controls provided by virtual controls selector 230, taking into account the location of the user within the virtual world, and the continuously updated position and orientation of the view of the user in the physical world, to provide an immersive representation of a product such as a vehicle. Accordingly, a user, e.g., using a display 120, can experience the generated virtual world in combination with the mock item 106, and can control aspects of the virtual world using provided virtual controls. The representation is described as immersive because the user controls the visual experience within the context of the physical environment 105 and thereby controls a view of the virtual world provided by the system 100. Output of immersive representation generator may include a tracking stream 110 that may be provided to the virtual reality server 115, and used to provide a virtual experience for users of devices 120.

Figure 3A:
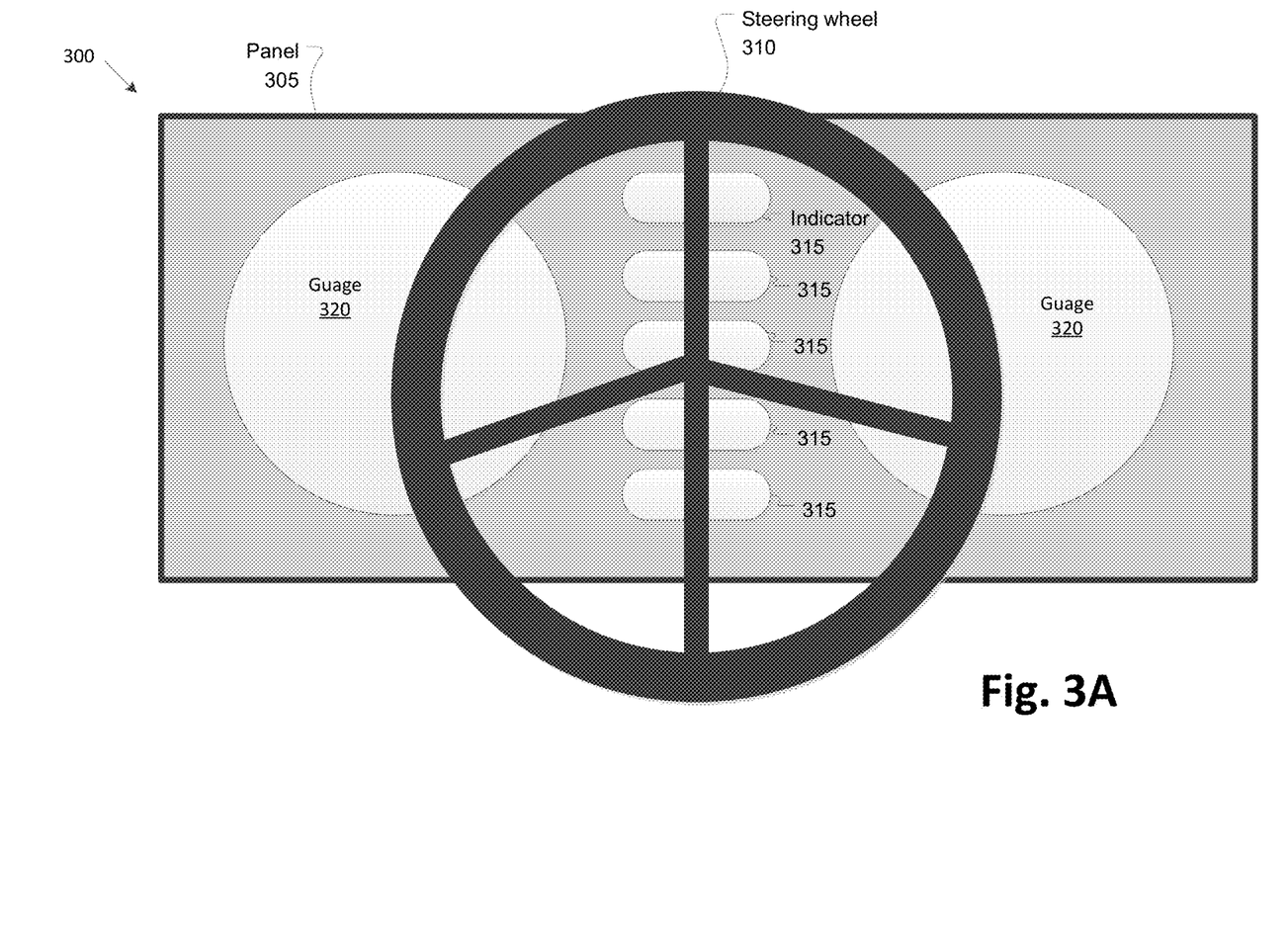
FIG. 3A includes exemplary illustration of a hybrid representation of a portion of a vehicle.

FIG. 3A an exemplary illustration of a hybrid representation 300 of a portion of a vehicle. That is, certain elements of the hybrid representation 300 are physical components of a mock item 106, in this case a mock vehicle, while other elements of the hybrid representation 300 are virtual representations, i.e., virtual components of a vehicle. For example, the hybrid representation 300 includes a dash panel 305, and a steering wheel 310. The dash panel 305 is generally a physical component included in mock item 106, e.g., a mock vehicle, designed to have the dimensions and the shape of a dash panel that is being considered for inclusion in a vehicle design. As will be mentioned below with respect to FIGS. 3A-3D, using closed-cell expanded polystyrene foam that is milled into geometric shapes (possibly connected together with glue compound) determined by component geometry for components such as dash panel 305 allows such components to be quickly created, transported, and swapped in and out of position in the mock item 106.

Steering wheel 310 is also a physical portion of the mock item 106, e.g., in the exemplary mock item 106 being discussed, the steering wheel 310 is part of a mock vehicle. Thus, the panel 305 and the steering wheel 310 are physical structures that a user can touch and physically interact with. A mock item 106 such as a mock vehicle may include many other physical components, or mockups of physical components, e.g., made of milled foam or the like, not shown in the figures, such as a seat in which a user may sit, door frames, shift levers, mirrors, etc.

The hybrid representation 300 may also include virtual elements such as indicators 315, gauges 320, and possibly also other elements that could be included on a vehicle instrument panel such as the panel represented by dash panel 305. For example, indicators 315 may represent indicator lights or the like that may be included on a vehicle dash or instrument panel, e.g., lights that are illuminated on an instrument panel to indicate problems with engine temperature, tire pressure, oil pressure, electrical power, etc. Likewise, gauges 320 may include gauges commonly found on a vehicle instrument panel, such as speed gauges, RPM gauges, fuel gauges, displays, etc. Moreover, as mentioned above, a hybrid representation 300 may include practically any vehicle components, and indeed, may include items and components of items other than vehicles.

Accordingly, a user could sit in a seat of a mock vehicle as if a driver of the vehicle, and could see and/or interact with various components of the vehicle, including physical components such as the panel 305 and the steering wheel 310, as well as virtual components, e.g., as may be projected by a head mounted display 120. Thus, virtual components such as indicators 315 and gauges 320 may be combined with physical components such as the panel 305 and the steering wheel 310 to provide a hybrid representation 300.

As mentioned above, virtual reality server 115, e.g., using physical environment mapper 210, performs a registration of physical environment 105 to a virtual environment generated by virtual reality server 115. For example, physical environment mapper 210 may register a shape and location of the panel 305, the steering wheel 310, and/or other components of a mock item 106 with the coordinates of a virtual environment. Sensors 125 may be used to provide data from volumetric region 126 to perform such mapping, and subsequently to track a user's location in the physical environment 105, and to provide an appropriate virtual representation of the virtual environment generated by the virtual reality server 115. Thus, when a user is within the physical environment 105, the combination of the physical environment 105, e.g., elements of a mock item 106, with the virtual representation, i.e., the hybrid representation 300, allows the user to evaluate a product design.

Because of the virtual environment is registered to the physical environment, including the location of physical elements such as panel 305 and steering wheel 310, virtual elements such as indicators 315 and gauges 320 may be realistically displayed in relation to the physical elements. For example, gauges 320 can be made to appear as if appropriate portions thereof are behind the steering wheel 310. Further, when a user wearing a head mounted display 120 turns his or her head, or otherwise moves in relation to the hybrid representation 300, the representation of the virtual elements such as indicators 315, gauges 320, etc. may be appropriately revised by virtual server 115.

For example, if a user wearing a head mounted display 120 turns his or her head, a different portion of a gauge 320 may be obscured, while a previously-obscured portion of the gauge 320 may be revealed. Such adjustments may be made, e.g., according to instructions and virtual reality server 115. In general, once a location of a display 120 being worn by a user in the physical environment 105 is registered to the virtual environment, the virtual reality server 115 is able to adjust the representation of virtual elements based display 120 movements, e.g., to reflect a change in the perspective of the user wearing display 120.

Figure 3B:
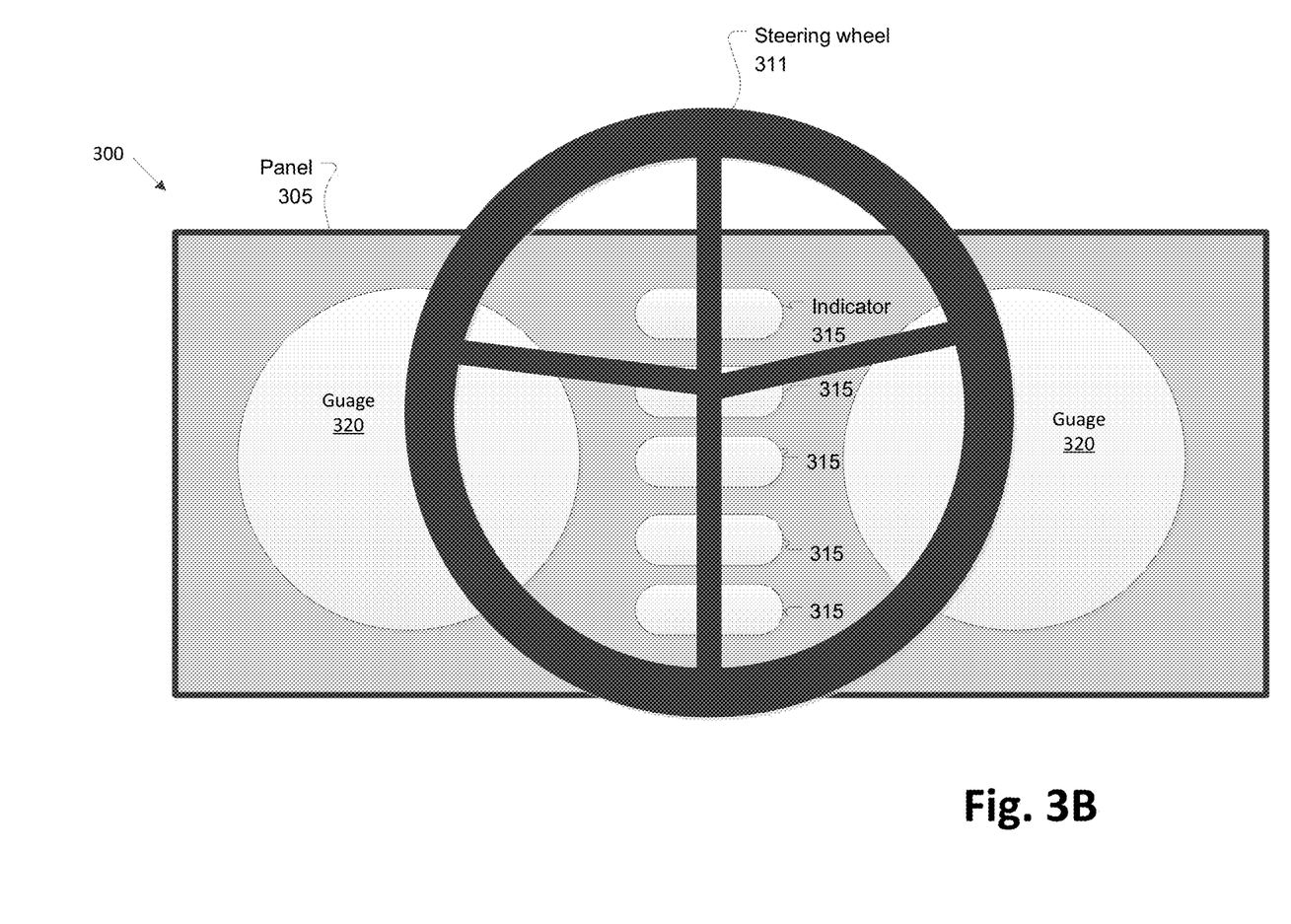
FIG. 3B includes a further exemplary illustration of a hybrid representation of a portion of a vehicle.

FIG. 3B provides a further exemplary illustration of a hybrid representation 300 of a portion of a vehicle. As can be seen, the panel 305, and indicators 315 and gauges 320 are placed similarly to the placement of these elements shown in FIG. 3A. However, the steering wheel 311 has been moved, i.e., is located in a higher position relative to the panel 305 compared to the location of the steering wheel 310 in FIG. 3A. Further, as can be seen, the configuration of the steering wheel 311 illustrated in FIG. 3B differs from the configuration of the steering wheel 310 shown in FIG. 3A.

Thus, FIG. 3B illustrates the ability to move a physical element within a mock item 106 relative to other physical elements as well as virtual elements, e.g., indicators 315, gauges 320, etc. Of course, more than one physical element could be so moved or relocated. Further, FIG. 3B illustrates the ability to swap one physical element for another in a mock item 106, e.g., the steering wheel 311 for the steering wheel 310. Thus, as seen in FIG. 3B, the location and/or configuration of a physical element can be changed relative to virtual elements, e.g., indicators 315 and 320, to allow a user to evaluate different product designs.

Also, as with FIG. 3A, Figured 3B illustrates that representation of virtual elements 315, 320, etc. may be adjusted, e.g., according to instructions in virtual reality server 115, to be consistent with the registration of physical components of such a steering wheel 311 and panel 305 with a virtual environment, as well as with a user's perspective, e.g., a user's posture, seated position, etc., and changes in user perspective, e.g., according to movement of a user wearing a head mounted display 120.

Figure 3C:
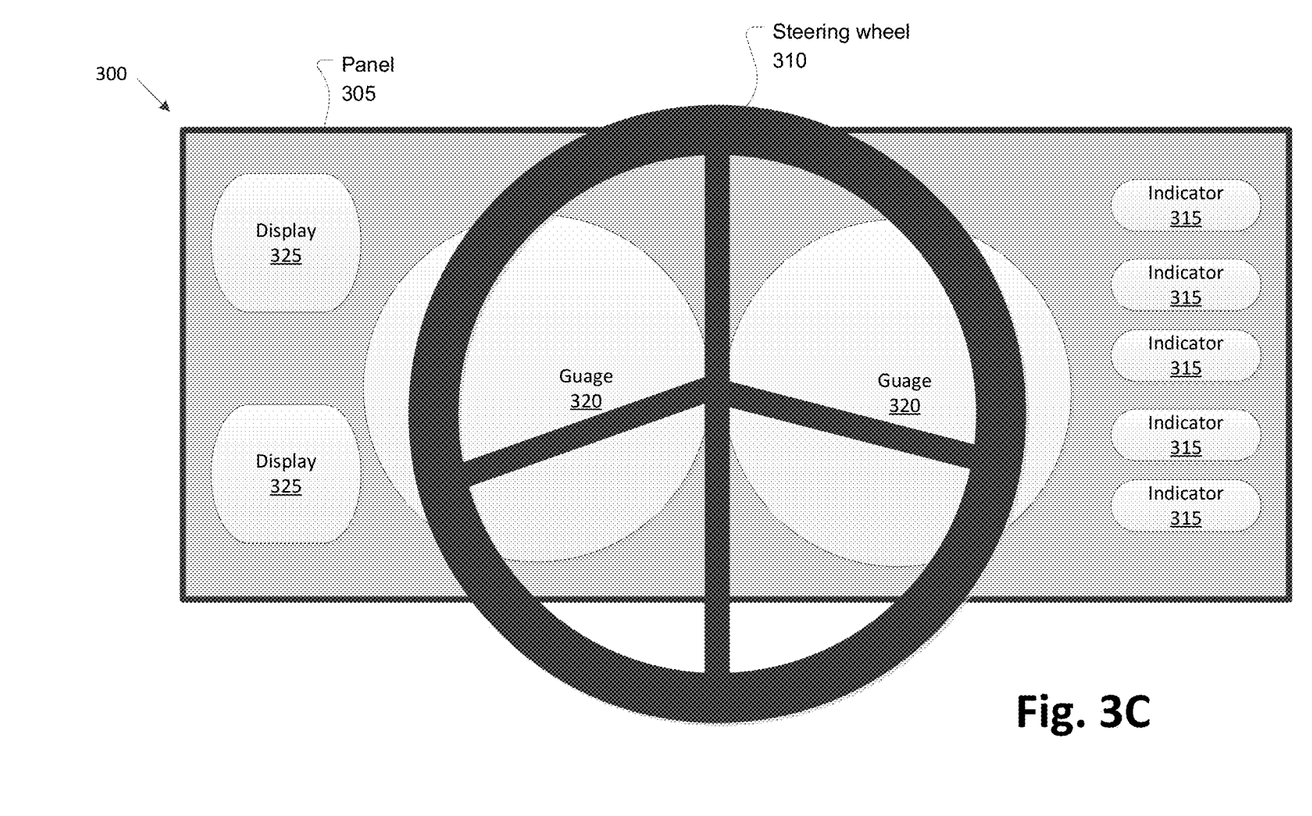
FIG. 3C includes yet a further exemplary illustration of a hybrid representation of a portion of a vehicle.

FIG. 3C provides yet a further exemplary illustration of a hybrid representation 300 of a portion of a vehicle. The location of physical elements relative to one another, i.e., in this example, the dash panel 305 and the steering wheel 310, is similar to the relative locations shown in FIG. 3A. However, the locations of indicators 315 and gauges 320, virtual elements shown overlaid on the dash panel 305, have changed from the locations shown in FIG. 3A. FIG. 3B also includes two displays 325, e.g., liquid crystal displays or displays including light emitting diodes such as could be used to display various information on a vehicle instrument panel such as may be represented by dash panel 305. Thus, FIG. 3C illustrates the ability to reconfigure virtual elements, e.g., indicators 315 and gauges 320 based on variations in product design.

In addition to simply reconfiguring virtual elements, virtual server 115 may include instructions to add (or, although not explicitly shown with respect to FIG. 3C, remove) virtual elements, e.g., displays 325, that are included in the virtual environment in relation to a physical element in a mock item 106, e.g., when elements such as indicators 315, gauges 320, displays 325, etc. are viewed via an interactive display 120 such as a head mounted display device, e.g., according to variations in product design.

Figure 3D:
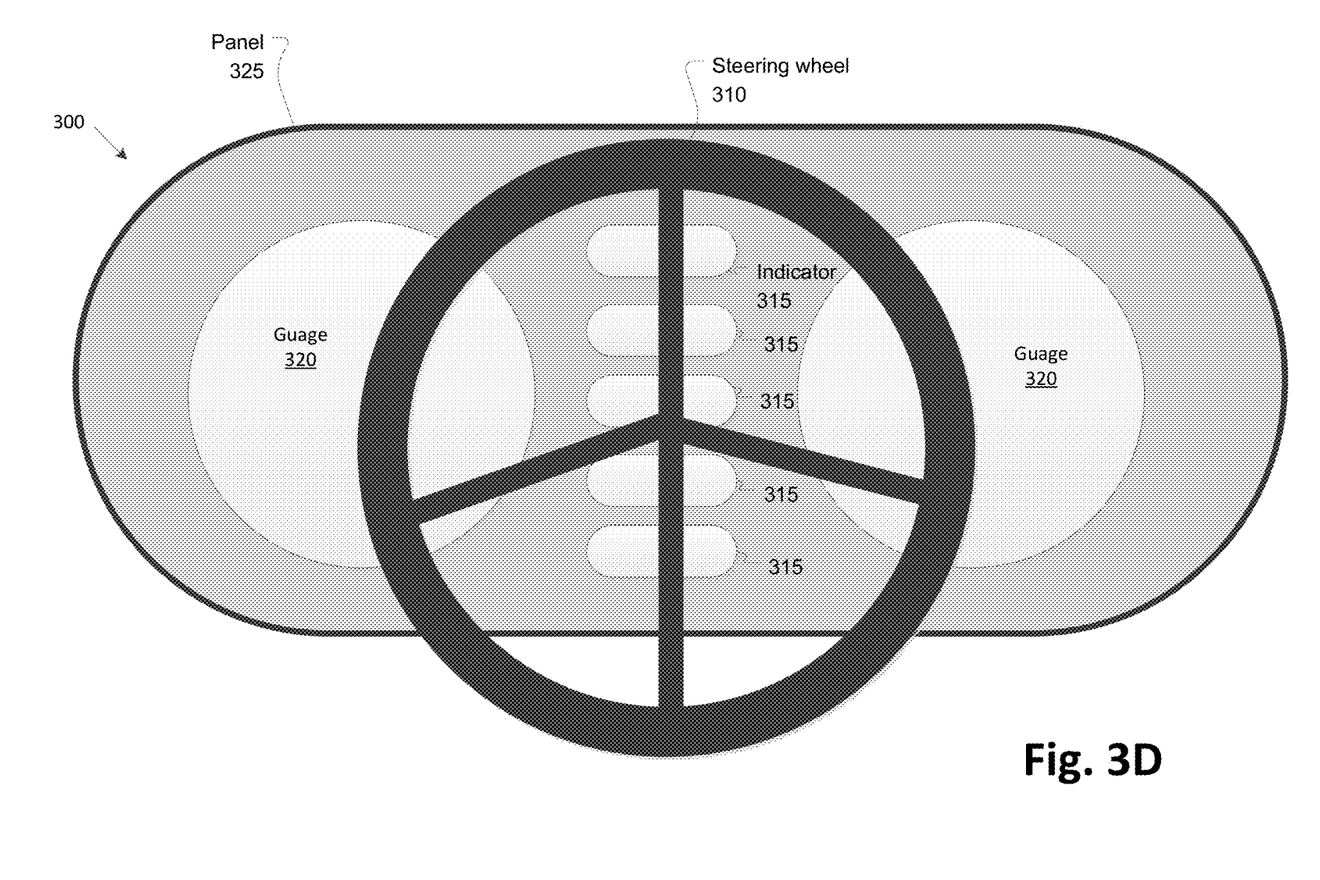
FIG. 3D includes yet a further exemplary illustration of a hybrid representation of a portion of a vehicle.

FIG. 3D provides yet a further exemplary illustration of a hybrid representation 300 of a portion of a vehicle. As seen in FIG. 3D, the panel 305 of FIGS. 3A-C has been replaced by a differently-shaped panel 325, although other elements of the hybrid representation 300 remain similar to FIG. 3A. Thus, FIG. 3D once again illustrates the ability to swap elements, e.g., panel 325 for the panel 305, in a mock item 106. A user can thus easily evaluate different designs of product elements with respect to virtually represented elements, e.g., indicators 315 and gauges 320.

Figure 4A:
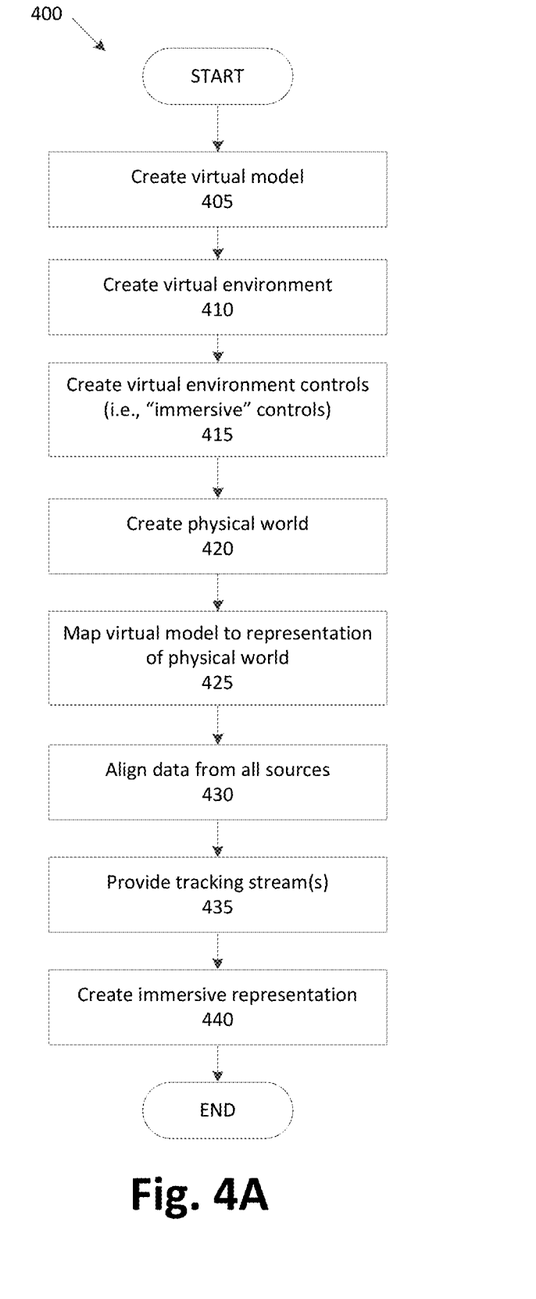
FIG. 4A illustrates an exemplary process for using the system of FIG. 1, including a hybrid representation.

FIG. 4A illustrates an exemplary process for using the system 100, including a hybrid representation 300.

The process 400 begins in a step 405, in which virtual model generator 215, included in the virtual reality server 115, is used to create a virtual model of a product or at least components of a product, e.g., virtual components of a vehicle, for use in a virtual world.

Next, in step 410, virtual environment generator 220 is used to create a virtual environment in which the model created in step 405 may be included. For example, a virtual environment includes a coordinate system in which virtual objects may be referenced, as well as virtual objects, e.g., indicators 215, gauges 220, displays 225, etc., as well as background objects and the like for completing the virtual environment.

Next, in step 415, virtual controls selector 225 is used to create virtual environment controls, sometimes referred to as immersive or virtual controls such as may be generated by virtual control selector 225 as discussed above, for use when viewing a virtual model of a vehicle.

Next, in step 420, physical environment mapper 210 is used to identify a physical world associated with the virtual environment created in step 410. That is, a coordinate system is imposed on a physical environment with points that may be mapped to the virtual environment.

Next, in step 425, physical environment mapper 210 maps the physical world to the virtual environment. Sometimes this mapping is referred to as registration, or registering the physical and virtual worlds.

Next, in step 430, virtual world generator 205 aligns all data to be included in the virtual world. For example, after the physical world is mapped to the virtual environment, the virtual model generated as discussed with respect to step 405 must be placed in the virtual environment.

Next, in step 435, virtual reality server 115 receives a data stream 110, e.g., from tracking module 109. Further, more than one virtual reality server 115 may receive the data stream 110, although only one server 115 is depicted in FIG. 1.

Next, in step 440, immersive representation generator 230, using the data stream 110 received in step 435, along with the virtual environment and virtual model discussed above with respect to steps 405-430, generates an immersive representation that may be experienced by a user of display 120 and/or virtual reality server 115, server 115 including instructions for tracking position and/or orientation.

Step 440 may be continued as long as a data stream 110 is being provided, and the virtual environment within the virtual model is maintained. As discussed above, while the data stream 110 is being provided, and virtual reality server 115 is providing a virtual environment to complement the physical environment 105 to create a hybrid environment 300, a user may, for example, interact with elements of a mock item 106, e.g., elements representing item components such as dash panel 305, steering wheel 310, etc., as well as virtual elements such as indicators 315, gauges 320, displays 325, etc. For example, when a user wearing a display 120 moves, a representation of virtual elements of the hybrid display 300 changes according to a new perspective of the user of the display 120.

Once step 440 terminates, the process 400 ends.

Advantageously, when components of a mock item 106, e.g., a dash panel 305, steering wheel 310, etc., are changed, e.g., as reflected in the difference between dash panel 305 in FIG. 3A and the panel 325 of FIG. 3D, process 400 may be repeated to facilitate efficient review of different product designs, e.g., vehicle designs.

Computing devices such as virtual reality server 115, etc. may employ any of a number of computer operating systems known to those skilled in the art, including, but by no means limited to, known versions and/or varieties of the Microsoft Windows® operating system, the Unix operating system (e.g., the Solaris® operating system distributed by Oracle Corporation of Redwood Shores, Calif.), the AIX UNIX operating system distributed by International Business Machines of Armonk, N.Y., the Linux operating system, Apple OS-X Operating Systems, and/or Mobile Operating Systems, the Android operating system, etc. Computing devices may include any one of a number of computing devices known to those skilled in the art, including, without limitation, a computer workstation, a desktop, notebook, laptop, tablet computer, smartphone, or handheld computer, or some other computing device known to those skilled in the art.

Computing devices such as the foregoing, e.g., server 115, generally each include instructions executable by one or more computing devices such as those listed above. Computer-executable instructions may be compiled or interpreted from computer programs created using a variety of programming languages and/or technologies known to those skilled in the art, including, without limitation, and either alone or in combination, Java™, C, C++, Visual Basic, Java Script, Perl, etc. In general, a processor (e.g., a microprocessor) receives instructions, e.g., from a memory, a computer-readable medium, etc., and executes these instructions, thereby performing one or more processes, including one or more of the processes described herein. Such instructions and other data may be stored and transmitted using a variety of known computer-readable media.

A computer-readable medium includes any medium that participates in providing data (e.g., instructions), which may be read by a computer. Such a medium may take many forms, including, but not limited to, non-volatile media, volatile media, and transmission media. Non-volatile media include, for example, optical or magnetic disks and other persistent memory. Volatile media include dynamic random access memory (DRAM), which typically constitutes a main memory. Transmission media include coaxial cables, copper wire and fiber optics, including the wires that comprise a system bus coupled to the processor. Transmission media may include or convey acoustic waves, light waves and electromagnetic emissions, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, a carrier wave as described hereinafter, or any other medium from which a computer can read.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claimed invention.

Accordingly, it is to be understood that the above description is intended to be illustrative and not restrictive. Many embodiments and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

All terms used in the claims are intended to be given their broadest reasonable constructions and their ordinary meanings as understood by those skilled in the art unless an explicit indication to the contrary in made herein. In particular, use of the singular articles such as "a," "the," "said," etc. should be read to recite one or more of the indicated elements unless a claim recites an explicit limitation to the contrary.

What is claimed is:

1. A system, comprising:
    a computer server having a processor and a memory, the server programmed to:
        generate a virtual environment, including at least one virtual portion of an item;
        generate a mapping of the virtual environment to a physical environment that includes a physical portion of the item; and
        provide data for rendering at least one image of the virtual, but not the physical environment, to at least one computer display device;
    wherein the at least one computer display device includes a transparency through which the physical environment may be viewed, the computer display device being programmed to display at least one virtual portion of the item using the data relating to the virtual environment such that the virtual portion is displayed in relation to the physical element, the physical element being viewable through the transparency, according to the mapping,
    wherein the virtual portion and the physical portion are provided for viewing together as at least a subset of the item, and
    further wherein the computer server is programmed to adjust the at least one virtual portion according to a substitution of the second physical portion for the first physical portion, and to adjust the at least one virtual portion according to a variation in product design.

2. The system of claim 1, wherein the computer server is further programmed to adjust the at least one virtual portion according to movement of the display.

3. The system of claim 1, wherein the computer server is further programmed to register a location of the display in the physical environment according to a coordinate system for the physical environment used for the mapping.

4. The system of claim 1, further comprising at least one second physical portion of the item.

5. The system of claim 1, further comprising at least one second physical portion representing the first component of the item, wherein the second physical portion may be substituted for the first physical portion in the physical environment.

6. A method, comprising:
- generating, in a computing device having a processor and a memory, a virtual environment, including at least one virtual portion element representing a component of an item;
- mapping the virtual environment to a physical environment that includes a physical portion of the item; and
- providing data for rendering at least one image of the virtual, but not the physical environment, to at least one computer display device;
- wherein the at least one computer display device includes a transparency through which the physical environment may be viewed, the computer display device being programmed to display at least one virtual portion of the item using the data relating to the virtual environment such that the virtual portion is displayed in relation to the physical element, the physical element being viewable through the transparency, according to the mapping,
- wherein the virtual portion and the physical portion are provided for viewing together as at least a subset of the item,
- further wherein the method further comprises adjusting the at least one virtual portion according to a substitution of the second physical portion for the first physical portion, and adjusting the at least one virtual portion according to a variation in product design.

7. The method of claim 6, wherein the virtual environment includes at least one second physical portion of the item.

8. The method of claim 6, wherein the virtual environment includes at least one second physical portion representing the first component of the item, and further wherein the second physical portion may be substituted for the first physical portion in the physical environment.

9. The method of claim 8, wherein the computer server is further configured to adjust the at least one virtual portion according to a substitution of the second physical element for the first physical portion.

10. The method of claim 6, further comprising adjusting the at least one virtual portion according to a variation in product design.

11. A non-transitory computer readable medium tangibly embodying a set of instructions executable by a computer processor, the instructions comprising instructions for:
- generating, in a computing device having a processor and a memory, a virtual environment, including at least one virtual portion of an item;
- mapping the virtual environment to a physical environment that includes a physical portion of the item; and
- providing data for rendering at least one image of the virtual environment, but not the physical environment, to at least one computer display device;
- wherein the at least one computer display device includes a transparency through which the physical environment may be viewed, the computer display device being programmed to display at least one virtual portion of the item using the data relating to the virtual environment such that the virtual portion is displayed in relation to the physical element, the physical element being viewable through the transparency, according to the mapping,
- wherein the virtual portion and the physical portion are provided for viewing together as at least a subset of the item, and
- further wherein the instructions further comprise instructions for adjusting the at least one virtual portion according to a substitution of the second physical portion for the first physical portion, and adjusting the at least one virtual portion according to a variation in product design.

12. The medium of claim 11, wherein the virtual environment includes at least one second physical portion representing at least one second component of the item.

13. The medium of claim 11, wherein the virtual environment includes at least one second physical portion representing the first component of the item, and further wherein the second physical portion may be substituted for the first physical portion in the physical environment.

14. The medium of claim 11, wherein the computer server is further configured to adjust the at least one virtual portion according to a substitution of the second physical portion for the first physical portion.

15. The medium of claim 11, further comprising instructions for adjusting the at least one virtual portion according to a variation in product design.

* * * * *